(12) United States Patent
Hornung

(10) Patent No.: US 8,324,897 B2
(45) Date of Patent: Dec. 4, 2012

(54) DIGITAL NMR SIGNAL PROCESSING SYSTEMS AND METHODS

(75) Inventor: Phillip Allen Hornung, Union City, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 440 days.

(21) Appl. No.: 12/616,727

(22) Filed: Nov. 11, 2009

(65) Prior Publication Data
US 2011/0109310 A1    May 12, 2011

(51) Int. Cl.
*G01V 3/00* (2006.01)
*G01R 33/20* (2006.01)
(52) U.S. Cl. ......... 324/309; 324/308; 324/317; 324/322
(58) Field of Classification Search ........... 324/300–324
See application file for complete search history.

(56) References Cited

U.S. PATENT DOCUMENTS

| 4,184,110 | A |   | 1/1980 | Hinshaw |  |
|---|---|---|---|---|---|
| 5,166,620 | A |   | 11/1992 | Panosh |  |
| 5,529,068 | A |   | 6/1996 | Hoenninger, III et al. |  |
| 8,049,505 | B2 | * | 11/2011 | Van Liere | 324/322 |
| 2002/0130661 | A1 | * | 9/2002 | Raftery et al. | 324/318 |
| 2006/0158186 | A1 | * | 7/2006 | Park et al. | 324/307 |
| 2007/0224698 | A1 |   | 9/2007 | Jesmanowicz |  |

OTHER PUBLICATIONS

Giovannetti, et al., "Application of Undersampling Technique for the Design of an NMR Signals Digital Receiver", Concepts in Magnetic Resonance Part B, vol. 29B(3), pp. 107-114.

Jerzy Bodurka et al.,"Scalable Multichannel MRI Data Acquisition System," Magnetic Resonance in Medicine, 2004, pp. 165-171.

I.L. Dalal, "A Low-Cost Scalable Multichannel Digital Receiver for Magnetic Resonance Imaging", Engineering in Medicine and Biology Society, Proceedings of the 28th IEEE, EMBS Annual International Conference, Publication Year: 2006 , pp. 1897-1900.

P. Sipila et al., "Digital Multiband Receiver for Magnetic Resonance", Concepts in Magnetic Resonance Part B, vol. 35B, Oct. 28, 2009, pp. 210-220.

X Qin et al., "Compensation for Unknown Acquisition Delay Caused by Digital receiver without external synchronization in NMR and MRI", Magnetic Resonance Materials in Physics, Biology and Medicine, Chapman and Hall, London, GB, vol. 18, No. 4, Sep. 1, 2005, pp. 214-224.

* cited by examiner

*Primary Examiner* — Jermele M Hollington
*Assistant Examiner* — Emily Chan

(57) ABSTRACT

In some embodiments, a nuclear magnetic resonance (NMR) receiver using digital downconversion and subsampling tracks transmit and/or receive signal phases according to time(s) elapsed since reference times (e.g. reset times) corresponding to known phases. Carrier-frequency ($f_c$) NMR signals are digitized directly, using a sampling frequency ($f_s$) lower than $f_c$. Digital downconversion and carrier phase correction are performed to yield NMR modulations of interest. A phase determination circuit may include an N-bit counter incremented at $f_s$ and an associated count register storing an indicator of a time elapsed since a carrier generator reset for each transient sampling period start, A real-time controller synchronously resets the counters and corresponding signal generators. A sin/cos lookup table maps counts to phase correction function values. Described exemplary systems and methods allow applying phase correction(s) to detected NMR signals to compensate for system changes such as transmitter or downconverter NCO resets or carrier frequency changes.

24 Claims, 4 Drawing Sheets

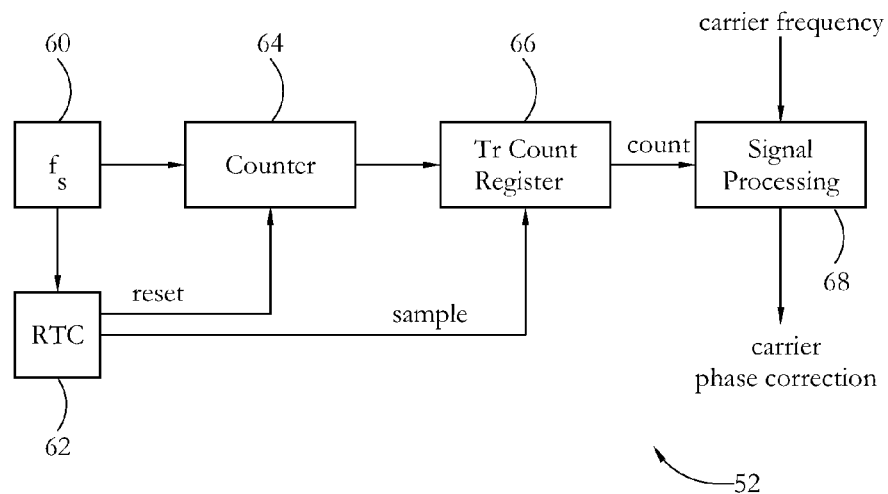
FIG. 5-A
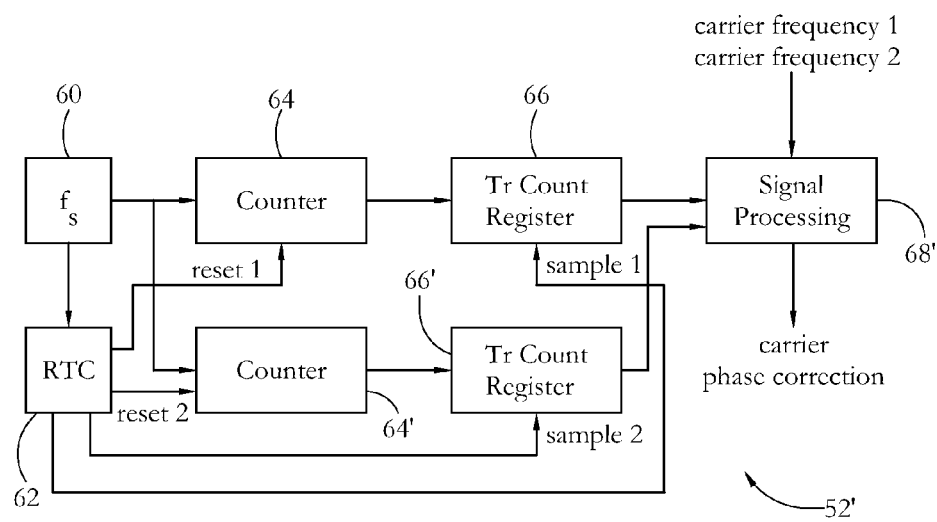
FIG. 5-B

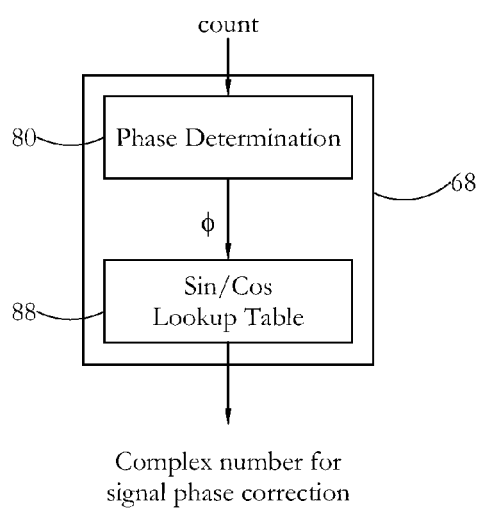
FIG. 6-A
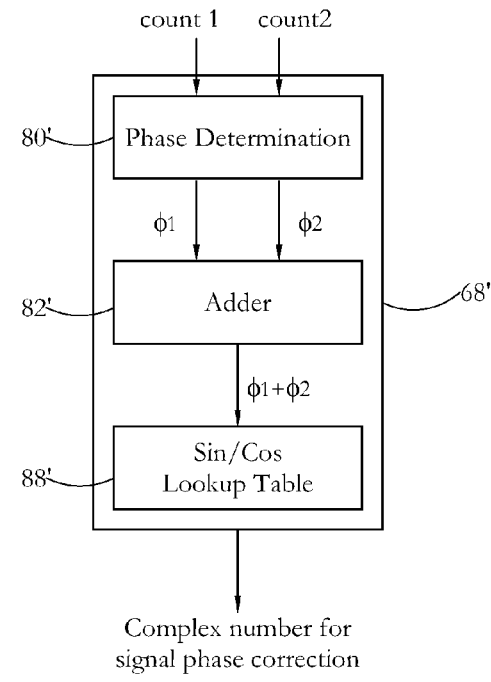
FIG. 6-B

DIGITAL NMR SIGNAL PROCESSING SYSTEMS AND METHODS

BACKGROUND OF THE INVENTION

The invention relates to nuclear magnetic resonance (NMR) spectroscopy, and in particular to systems and methods for forming demountable cryogenic NMR connections in NMR spectrometers.

Nuclear magnetic resonance (NMR) spectrometers typically include a superconducting magnet for generating a static magnetic field $B_0$, and an NMR probe including one or more special-purpose radio-frequency (RF) coils for generating a time-varying magnetic field $B_1$ perpendicular to the field $B_0$, and for detecting the response of a sample to the applied magnetic fields. Each RF together with its associated circuitry can resonate at the Larmor frequency of a nucleus of interest present in the sample. The RF coils are typically provided as part of an NMR probe, and are used to analyze samples situated in sample tubes or flow cells.

An NMR frequency of interest is determined by the nucleus of interest and the strength of the applied static magnetic field $B_0$. In order to maximize the sensitivity of NMR measurements, the resonant frequency of the excitation/detection circuitry is set to be equal to the frequency of interest. NMR experiments use information on the phase relationships between acquired data sets (vectors) in order determine a number of types of information. Such information may include spatial information, chemical shifts, and inter-nuclear contact times.

NMR systems commonly use superheterodyne-like receivers to detect the response of NMR samples to applied RF energy. During a transmit phase, a local oscillator signal is mixed with a continuous-wave or pulsed intermediate-frequency signal using a transmit-side mixer to generate a transmit NMR signal, which is applied to the sample of interest. During a subsequent receive phase, the received NMR signal is mixed with the local oscillator signal using a receive-side mixer to generate an intermediate-frequency receive signal indicative of the sample NMR response.

FIG. 1 shows an exemplary prior art NMR system 1000 including transmitter 1100 for applying RF energy to a sample coil 24, and a receiver 1200 for detecting an NMR signal from sample coil 24. Transmitter 1100 includes a mixer 1102, which mixes RF signals generated by a local oscillator 1104 and an intermediate-frequency (IF) source 1106. Receiver 1200 includes a mixer 1202, which mixes RF signals generated by local oscillator 1104 and received from sample coil 24 to yield an IF NMR signal of interest. Amplifiers 1204, 1206 are used to amplify received signals before and after mixer 1202. The IF NMR signal may be digitized and processed further to yield desired NMR data such as NMR spectra.

Such transmit/receive signal processing schemes are capable of accurately generating and detecting NMR signals of interest, which commonly have low amplitudes and high frequencies. At the same time, such signal processing schemes can add significant complexity and cost to NMR systems, and analog mixers can introduce spurs or other signal artifacts. Some multi-channel NMR systems may employ 16-20 mixers and associated cables and other RF components.

SUMMARY OF THE INVENTION

According to one aspect, a nuclear magnetic resonance (NMR) measurement method comprises synchronizing a transmit signal synthesizer and a sampling counter, wherein the transmit signal synthesizer generates at least a carrier-frequency component of an NMR radio-frequency (RF) transmit signal; incrementing a signal sampling count generated by the sampling counter and digitally sampling a received NMR signal at a sampling frequency $f_s$ lower than a carrier frequency $f_c$ of the carrier-frequency component of the transmit NMR signal and a received NMR signal, wherein the received NMR signal is generated by an NMR sample in response to the transmit signal; storing a value of the sampling count indicating the transmit phase of the transmit signal with reference to a time of synchronizing the transmit signal synthesizer and sampling counter; digitally downconverting the received NMR signal; and performing a phase correction to the digitized downconverted NMR signal according to the stored value of the sampling count.

According to another aspect, an NMR apparatus comprises: a transmit signal synthesizer configured to generate at least a carrier-frequency component of an NMR radio-frequency (RF) transmit signal transmitted to a NMR RF coil, the carrier-frequency component having a carrier frequency $f_c$; an analog-to-digital converter configured to digitally sample a received NMR signal at a sampling frequency $f_s$ lower than the carrier frequency $f_c$, wherein the received NMR signal is generated by an NMR sample in response to the transmit signal, wherein the received NMR signal sampled by the analog-to-digital converter has the carrier frequency $f_c$; a sampling counter storing a signal sampling count incremented at the sampling frequency $f_s$; a sampling count register connected to the sampling counter and configured to store a value of the signal sampling count indicating a transmit phase of the transmit signal with reference to a time of a synchronization of the transmit signal synthesizer and sampling counter; a real-time controller connected to the transmit signal synthesizer and the transmit signal sampling counter, and configured to synchronize the transmit signal synthesizer and the transmit signal sampling counter; a digital downconverter connected to the analog-to-digital converter and to the signal processing logic, and configured to digitally downconvert the received NMR signal; and signal processing logic connected to the sampling count register and the digital downconverter and configured to perform a phase correction to the digitized downconverted NMR signal according to the stored value of the sampling count.

According to another aspect, an NMR measurement method comprises digitizing a received NMR signal at a sampling frequency $f_s$, the received NMR signal having a carrier frequency component having a carrier frequency $f_c$ higher than the sampling frequency $f_s$; using a hardware counter to periodically increment a count indicative of a phase of the carrier frequency component with reference to a reference event; digitally downconverting the digitized received NMR signal; and performing a phase correction to the digitized received NMR signal according to the count.

According to another aspect, an NMR apparatus comprises an analog-to-digital converter configured to digitize a received NMR signal at a sampling frequency $f_s$, the received NMR signal having a carrier frequency component having a carrier frequency $f_c$ higher than the sampling frequency $f_s$; a counter configured to periodically increment a count indicative of a phase of the carrier frequency component with reference to a reference event; a digital downconverter connected to the analog-to-digital converter and the signal processing logic, and configured to digitally downconvert the digitized received NMR signal; and signal processing logic connected to the counter and the digital downconverter and configured to perform a phase correction to the digitized NMR signal according to the count.

BRIEF DESCRIPTION OF THE DRAWINGS

The foregoing aspects and advantages of the present invention will become better understood upon reading the following detailed description and upon reference to the drawings where:

FIG. 5-A shows an exemplary digital NMR carrier phase determination circuit according to some embodiments of the present invention.

FIG. 5-B shows an exemplary multi-synthesizer digital NMR carrier phase determination circuit according to some embodiments of the present invention.

FIG. 6-A shows a signal processing logic part of an exemplary digital NMR carrier phase determination circuit including a lookup table, according to some embodiments of the present invention.

FIG. 6-B shows a signal processing logic part of another exemplary digital NMR carrier phase determination circuit including a lookup table, according to some embodiments of the present invention.

DETAILED DESCRIPTION OF PREFERRED EMBODIMENTS

In the following description, a set of elements includes one or more elements. A plurality of elements includes two or more elements. Any reference to an element is understood to encompass one or more elements. Each recited element or structure can be formed by or be part of a monolithic structure, or be formed from multiple distinct structures. Unless otherwise stated, any recited electrical or mechanical connections can be direct connections or indirect operative connections through intermediary structures. The statement that two events occur synchronously is understood to mean that the two events occur on a common clock cycle. Unless otherwise specified, incrementing a counter encompasses incrementing in steps of one as well as steps larger than one, and monotonously increasing incrementing as well as modulo incrementing; for example, in some embodiments, a time counter is incremented monotonously in steps of one, while a phase counter is incremented in a phase step described in phase units (e.g. degrees, radians or fractions thereof), modulo 360 degrees (or $2\pi$ radians). Unless otherwise specified, a time count refers to a monotonously-incremented count, while a phase count refers to a count incremented modulo a full phase cycle. Unless otherwise specified, the term "logic" encompasses special-purpose hardware (e.g. part of an application-specific integrated circuit, ASIC), as well as programmable logic (e.g. part of a field-programmable gate array, FPGA, programmable digital-signal processor, DSP, or other programmable processor such as a microcontroller).

The following description illustrates embodiments of the invention by way of example and not necessarily by way of limitation.

Figure 1:
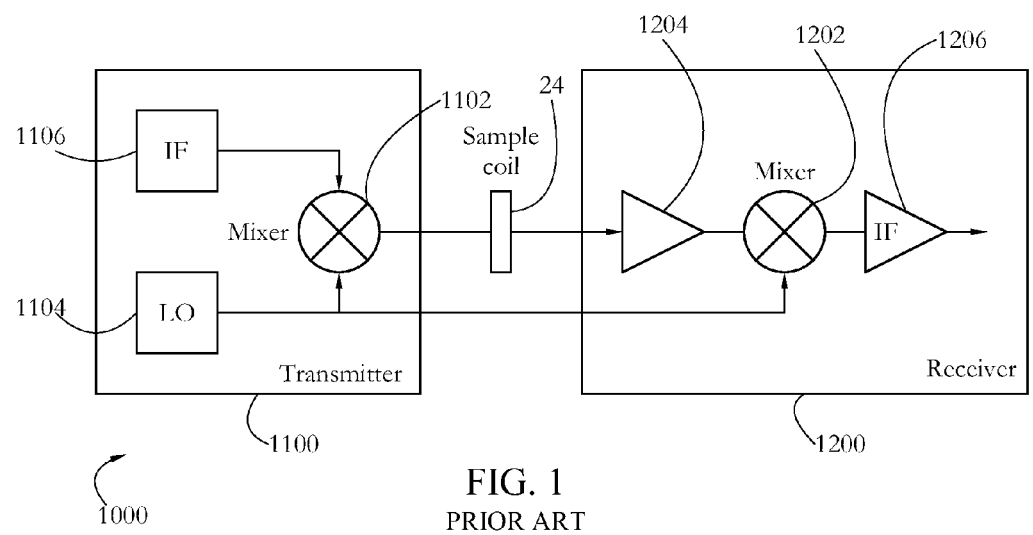
FIG. 1 shows part of an exemplary prior art NMR circuit employing analog mixers.
Figure 2:
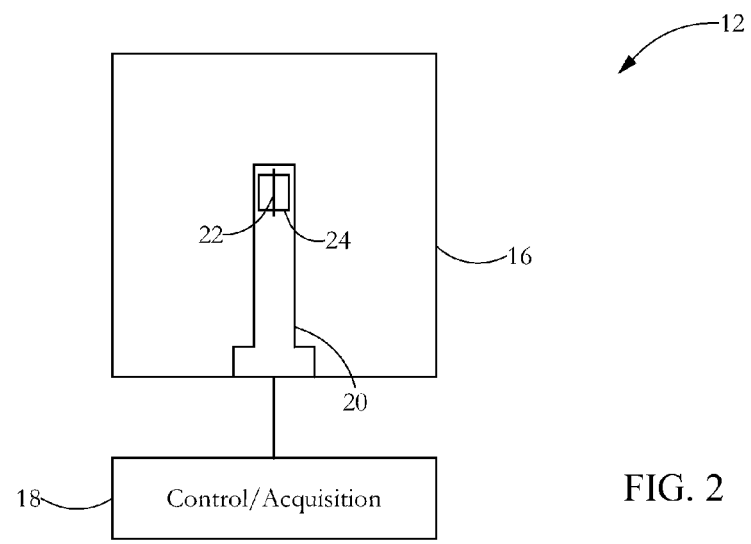
FIG. 2 is a schematic diagram of an exemplary NMR spectrometer according to some embodiments of the present invention.

FIG. 2 is a schematic diagram illustrating an exemplary nuclear magnetic resonance (NMR) spectrometer 12 according to some embodiments of the present invention. Spectrometer 12 comprises a magnet 16, an NMR probe 20 inserted in a cylindrical bore of magnet 16, and a control/acquisition system 18 electrically connected to magnet 16 and probe 20. Probe 20 has one or more measurement channels, and includes one or more radio-frequency (RF) coils 24 and associated electrical circuit components. For simplicity, the following discussion will focus on a single RF coil 24, although it is understood that a system may include other similar coils. RF coil 24 and the various components connected to RF coil 24 form one or more NMR measurement circuits. A sample vessel 22 is positioned within probe 20, for holding an NMR sample of interest within RF coil 24 while measurements are performed on the sample. Sample vessel 22 may be a sample tube or a flow cell.

To perform a measurement, a sample is inserted into a measurement space defined within RF coil 24. Magnet 16 applies a static magnetic field $B_0$ to the sample held within sample container 22. Control/acquisition system 18 comprises electronic components configured to apply desired radio-frequency pulses or a continuous-wave excitation signal to probe 20, and to acquire data indicative of the nuclear magnetic resonance properties of the sample within probe 20. RF coil 24 is used to apply radio-frequency magnetic fields $B_1$ to the sample, and/or to measure the response of the sample to the applied magnetic fields. The RF magnetic fields are perpendicular to the static magnetic field. The same coil may be used for both applying an RF magnetic field and for measuring the sample response to the applied magnetic field. Alternatively, one coil may be used for applying an RF magnetic field, and another coil for measuring the response of the sample to the applied magnetic field. A single coil may be used to perform measurements at multiple frequencies, by tuning the resonant frequency of the NMR measurement circuit that includes the coil. Tuning the circuit resonant frequency may be achieved by adjusting the capacitance values of one or more variable capacitors included in the circuit. Adjusting one or more capacitance values may also be used to achieve impedance matching or other desired circuit characteristics.

Figure 3:
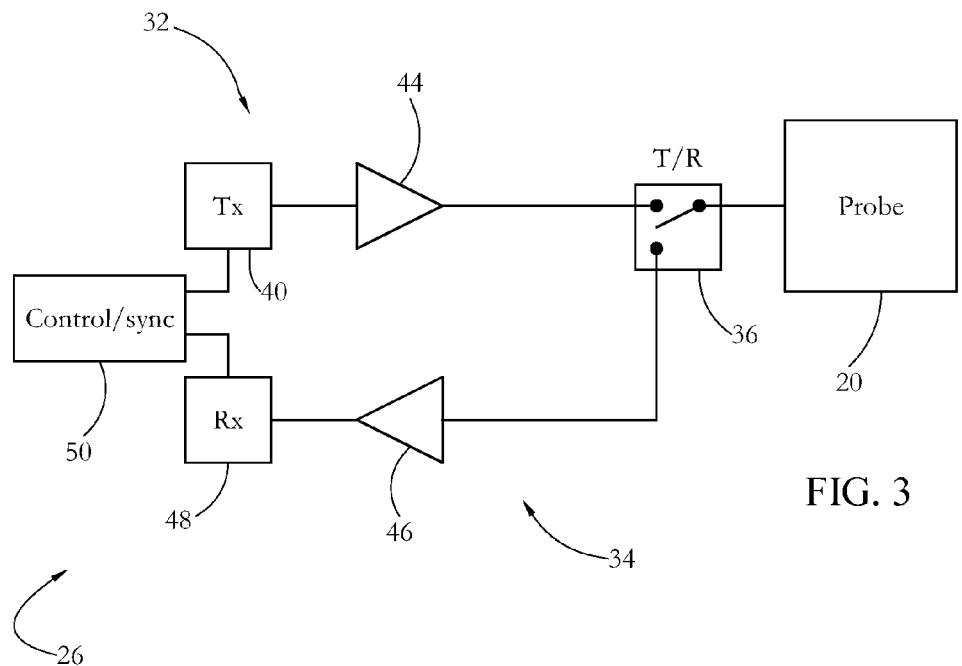
FIG. 3 shows an exemplary NMR system including a transmitter and receiver connected to an NMR probe through a transmit/receive switch, according to some embodiments of the present invention.

FIG. 3 shows an exemplary NMR measurement circuit 26 including a transmit circuit 32, a receive circuit 34, a transmit/receive (T/R) switch 36 alternatively connecting transmit circuit 32 and receive circuit 34 to probe 20, and a control/synchronization circuit (controller) 50 connected to transmit circuit 32 and receive circuit 34, according to some embodiments of the present invention. In a transmit phase of operation of spectrometer 12, T/R switch 36 connects transmitter 40 to probe 20. In a receive phase of operation of spectrometer 12, T/R switch 36 connects probe 20 to receiver 48. Measurement circuit 26 may include components not shown in FIG. 3 for simplicity; such components may include, among others, cables, tuning couplers, bias tees, fixed and/or variable attenuators, bandpass and/or other filters, and other known components.

Transmit circuit 32 includes a transmitter 40 and a power amplifier (transmit amplifier) 44 connected to a transmit port of T/R switch 36. A transmit path is defined from transmitter 40 to probe 20 in sequence through transmit power amplifier 44 and T/R switch 36. Transmitter 40 includes a signal generator including one or more frequency generators connected to corresponding amplitude and phase modulators. Amplitude modulation may be achieved using a variable attenuator. Transmitter 40 is capable of generating a transmit NMR signal including a carrier frequency component and a continuous-wave or pulsed NMR modulation component.

Receive circuit 34 includes a pre-amplifier (receive amplifier) 46 and a receiver 48 connected to a receive port of T/R switch 36. A receive path is defined from probe 20 to receiver 48 in sequence through T/R switch 36 and pre-amplifier 46. Receiver 48 detects NMR signals during a receive phase, as described in detail below. Receiver 48 may include filters, amplification stages, an analog-to-digital converter (ADC), and digital downconversion components. Receiver 48 receives and processes NMR measurement signals to yield digital NMR measurement signal data such as frequency spectra.

In particular, receiver 48 includes an analog-to-digital converter (ADC) configured to receive a NMR signal having a carrier frequency component and a NMR modulation component. The ADC digitizes the received signal at a sampling frequency $f_s$, which is lower than the carrier frequency $f_c$, but is capable of digitizing signals at the carrier frequency. In some NMR systems, a carrier frequency for proton measurements may have values between 300 MHz and 1 GHz, for example about 700 MHz. In some embodiments, in a system using a carrier frequency of between 300 MHz and 1 GHz, the ADC may use a sampling frequency value between 50 and 200 MHz, for example about 80 MHz. An appropriate sampling frequency may be chosen by a skilled artisan according to available equipment as well as the carrier frequency and deadband distribution resulting from a given carrier-frequency/sampling-frequency relationship. If deadbands are present around the sampling frequency, half the sampling frequency, and multiples thereof, a higher sampling frequency allows reducing the number of deadbands. An example of a suitable ADC in some embodiments is the LTC 2208 ADC, available from Linear Technology, Inc., which is capable of digitizing signals up to about 700 MHz, and has a maximum sampling rate of about 130 MHz. Receiver 48 may also include signal processing logic configured to perform a digital phase correction operation on received NMR signals as described below. In some embodiments, such signal processing logic may be provided as part of controller 50.

Controller 50 performs a number of control and signal processing steps, including synchronization and carrier phase determination steps, as described in detail below. In some embodiments, controller 50 may also perform one or more phase correction steps described below. Controller 50 is connected to and controls the operation of T/R switch 36, transmitter 40, and receiver 48, among others. Controller 50 is configured to set T/R switch 36 to a transmit state during a transmit phase of operation, and to a receive state during a receive phase of operation. Controller 50 is also configured to control NMR measurement pulse sequences and carrier-frequency signals generated by transmitter 40, as well as data acquisition and/or signal analysis performed by receiver 48.

In particular, controller 50 determines a phase of a carrier frequency component of a transmit signal used to generate the NMR signal digitized by receiver 48, and generates a complex-valued phase correction term according to the determined phase. The phase correction term can be applied to (multiplied with) a digitally-downconverted NMR signal to generate a phase-corrected NMR signal of interest as described below. The NMR signal of interest is the NMR modulation component of the received NMR signal, and is sometimes termed a free induction decay (FID) signal. Controller 50 determines the phase of the carrier frequency component according to a time elapsed since a reference event such as a reset of a carrier wave synthesizer forming part of transmitter 40.

Figure 4:
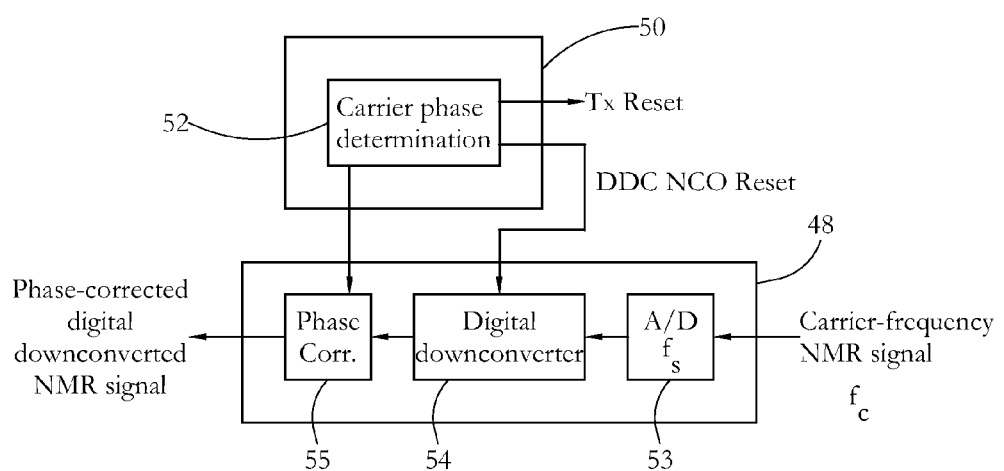
FIG. 4 shows an exemplary digital NMR receiver and phase determination circuit according to some embodiments of the present invention.

FIG. 4 shows receiver 48 and controller 50 according to some embodiments of the present invention. Controller 50 comprises a carrier phase determination unit 52. Receiver 48 includes an ADC 53, a digital downconverter 54 connected to ADC 53 and controller 50, and a phase correction unit 55 connected to digital downconverter 54 and controller 50. In some embodiments, carrier phase determination unit 52, digital downconverter 54 and phase correction unit 55 are implemented by special-purpose logic (hardware), including suitable registers as described below. In some embodiments, all or parts of carrier phase determination unit 52, digital downconverter 54 and/or phase correction unit 55 may also be implemented using a programmable processor and associated software configured to implement the steps described below.

Carrier phase determination unit 52 determines the phase of the carrier frequency component of the NMR signal digitized by ADC 53. In some embodiments, carrier phase determination unit 52 also generates transmit and/or receive reset signals which are used to independently reset one or more carrier-frequency synthesizers forming part of transmitter 40 and/or one or more numerically-controlled oscillators (NCOs) forming part of digital downconverter 54. Digital downconverter 54 receives digitized NMR data from ADC 53, and digitally subtracts a carrier frequency component to generate digitally-downconverted data. Phase correction unit 55 receives the digital downconverted data from digital downconverter 54, and an indicator of a carrier phase for each digitized NMR datum from carrier phase determination unit 52, and generates a phase-corrected digital downconverted NMR signal representing the NMR modulation of interest by multiplying the received downconverted data and a complex-valued function of the carrier phase described below. The phase-corrected downconverted data is further processed by control/acquisition unit 18 to generate NMR data of interest, such as NMR spectra.

FIG. 5-A shows an exemplary internal structure of digital NMR carrier phase determination circuit 52 according to some embodiments of the present invention. Circuit 52 includes a sampling frequency signal source (sampling clock) 60, an N-bit sampling counter 64 connected to clock 60, a sampling count register 66 connected to sampling counter 64, a signal processing unit 68 connected to sampling count register 66, and a real time controller 62 connected to clock 60, sampling counter 64, and sampling count register 66.

At desired times, for example at system startup or at the start of at least some transmit transient periods (transmit phases), real-time controller 62 sends reset commands resetting sampling counter 64 and one or more transmit synthesizer(s) of transmitter 40. In some embodiments, resets may occur at system startup (power-on), when the carrier frequency has or is to be changed, or to establish a reference time.

Upon reset, sampling counter 64 indicates a count of zero. In some embodiments, sampling counter 64 is a time counter, and generates a monotonously-increasing sampling count incremented by one on each clock signal generated by clock 60, i.e. after passage of a sample period $1/f_s$. A 30-bit time counter, which may be suitable for storing times up to about 300 years at 80 MHz, may be suitable as a time counter in some embodiments. In some embodiments, sampling counter 64 is a phase counter. The sampling count is incremented by a phase increment, which may differ from one, on each clock signal generated by clock 60, i.e. after passage of a sample period $1/f_s$. The phase increment may be appropriately determined according to the carrier frequency and sample period. A phase sampling count may be increased monotonously, or incremented modulo a carrier frequency phase cycle, i.e. periodically reduced by 360 degrees when the sampling count exceeds a cycle. A 20-bit counter may be suitable as a modulo phase counter in some embodiments.

At desired times, for example when a new transient sample period is to begin, real-time controller 62 sends a sample command (e.g a control strobe) to sampling count register 66. In response to the sampling command, sampling count register 66 stores (latches) the current value of sampling counter 64. Signal processing unit 68 receives the current stored count from sampling count register 66, and an identifier of the carrier frequency from system memory or other storage. Signal processing unit 68 uses the stored count, which indicates the time elapsed since the latest transmitter reset, and the carrier frequency to compute the carrier phase and a complex-valued carrier phase correction function at each sampling time point as described below. The carrier phase or a complex-valued phase correction function is transmitted to phase correction unit 55 (FIG. 4).

FIG. 5-B shows an exemplary internal structure of digital NMR carrier phase determination circuit 52' according to some embodiments of the present invention. Circuit 52' is suitable for determining a carrier phase correction for a carrier phase generated by mixing two (or more, by extension) carrier phase components. A common sampling count is sent by clock 60 to multiple counters 64, 64', each corresponding to a distinct carrier frequency component. Real-time controller 62 sends distinct sample and reset signals to counters 64, 64' and corresponding sampling count registers 66, 66'. Individual stored sampling counts are used by a signal processing unit 68' in conjunction with the corresponding carrier frequencies to compute a carrier phase and complex-valued carrier phase correction functions at each sampling time point.

FIG. 6-A shows an exemplary structure of signal processing unit 68 according to some embodiments of the present invention. Signal processing unit 68 includes a phase determination unit 80 connected to sampling count register 66 (FIG. 5-A), and a sine/cosine lookup table 88 connected to phase determination unit 80. Phase determination unit 80 receives a count from sampling count register 66b, and generates a phase equal to the count multiplied by the phase step of the count, modulo 360 degrees. Sin/cos lookup table 88 receives the computed phase, and generates sin and cos phase terms which form a complex-valued function to be used for a carrier phase correction. In some embodiments, the values provided by sin/cos lookup table 88 are generated by computing each value according to an analytical relation, rather than by retrieval from a lookup table.

FIG. 6-B shows an exemplary structure of signal processing unit 68' according to some embodiments of the present invention. Signal processing unit 68 includes a phase determination unit 80' connected to sampling count registers 66, 66', (FIG. 5-B) an adder 82' connected to phase determination unit 80', and a sine/cosine lookup table 88' connected to adder 82'. Phase determination unit 80' receives two counts from count registers 66, 66', and generates a first phase equal to the first count multiplied by the phase step of the first count, modulo 360 degrees, and a second phase equal to the second count multiplied by the phase step of the second count, modulo 360 degrees. Adder 82' adds the two received phase angles to generate a final phase angle. Sin/cos lookup table 88' receives the final phase angle, and generates sin and cos phase terms which form a complex number to be used for a carrier phase correction. In some embodiments, the values provided by sin/cos lookup table 88' may also be generated by computing each value according to an analytical relation, rather than by retrieval from a lookup table. The configuration of FIG. 6-B can be extended to higher numbers of frequencies/synthesizers.

The exemplary phase determination and carrier subtraction/phase correction operations described above can be better understood by considering the following theoretical discussion. The following discussion is intended to illustrate aspects of exemplary embodiments of the present invention, and is not intended to limit the invention.

Consider an NMR signal represented as a modulation in both amplitude and phase at a resonant frequency:

$$R(t)=S(t)\exp(-i2\pi f_c t+\phi) \quad [1]$$

wherein R(t) is the received NMR signal, S(t) is the NMR modulation imparted by the interaction of the sample of interest with the applied magnetic field(s), and $\exp(-i2\pi f_c t+\phi)$ is the carrier waveform, including phase, at the input of the A/D converter of receiver 48 (see FIG. 4).

The A/D converter evaluates the real part of the complex signal as:

$$R\Re(t)=\Re[(S^\Im(t)+iS^\Im(t))(\cos(2\pi f_c t+\phi)-i\sin(2\pi f_c t+\phi))], \quad [2a]$$

or $$R\Re(t)=S^\Im(t)\cos(2\pi f_c t+\phi)+S^\Im(t)\sin(2\pi f_c t+\phi)), \quad [2b]$$

wherein the indices $\Re$ and $\Im$ denote real and imaginary parts, respectively.

If the signal is sampled at a frequency $f_s$, the time domain maps in to a sample number domain with the substitution:

$$t = \frac{n}{f_s}, \quad [3]$$

where n is an integer. Eq. [3] can be written as $t=n\delta$, with $\delta$ defined as $1/f_s$. Substituting eq. [3] into eq. [2b] yields:

$$R_\Re\left(\frac{n}{f_s}\right) = S_\Re\left(\frac{n}{f_s}\right)\cos\left(2\pi\frac{f_c}{f_s}n\right) + \phi) + S_\Im\left(\frac{n}{f_s}\right)\sin\left(2\pi\frac{f_c}{f_s}n + \phi\right), \quad [4a]$$

or, in terms of $\delta$, $$R_\Re(\delta n) = S_\Re(\delta n)\cos\left(2\pi\frac{f_c}{f_s}n\right) + \phi) + S_\Im(\delta n)\sin\left(2\pi\frac{f_c}{f_s}n + \phi\right). \quad [4b]$$

If $f_c > 0.5 f_s$, the result is aliased because the sine and cosine functions are cyclic. An effective frequency $f_{eff}$ can be defined as $$f_{eff}=f_c \bmod(f_s/2), 0 \leq f_{eff} \leq f_s/2. \quad [5]$$

If we define $$\Gamma = 2\pi\frac{f_{eff}}{f_s},$$

where $0 \leq \Gamma < \pi$, the sampled signal can be re-written as:

$$R\Re(\delta n)=S\Re(\delta n)\cos(\Gamma n+\phi)+S^\Im(\delta n)\sin(\Gamma n+\phi). \quad [6]$$

If the sampling frequency is greater than twice the carrier frequency, the Nyquist criterion is met, and the detected (measured) signal is centered about the carrier frequency. In such a case, the effective frequency and the carrier frequency are identical. If the carrier is greater than half the sampling frequency, the carrier signal aliases to the effective frequency. The following description considers both normally sampled and undersampled cases by considering the effective frequency.

NMR signals can be represented as complex numbers with zero frequency set to the carrier (or effective carrier) frequency. A digital down converter can convert a digitized real signal centered at the carrier frequency into a complex baseband signal centered at zero frequency. A digital downconverter commonly employs a slaved pair of cosine and sine generators fixed in exact quadrature. The pair of generators may generally employ a frequency and a phase possibly different from the carrier.

The waveform generated by a pair of numerically-controlled oscillators (NCO) (a complex-valued NCO) of a digital downconverter may have a form $$S_{nco}(n) = \cos(\Gamma_1 n + \psi) - i \sin(\Gamma_1 n + \psi). \quad [7]$$

The real and imaginary terms may be handled in separate channels. The real and imaginary channel waveforms generated by mixing digital downconverter signals with a received NMR signal may be expressed as $$R\Re(\delta n) = (S\Re(\delta n)\cos(\Gamma n + \phi) + S\Im(\delta n)\sin(\Gamma n + \phi))\cos(\Gamma_1 n + \psi), \quad [8a]$$

$$R\Im(\delta n) = -(S\Re(\delta n)\cos(\Gamma n + \phi) + S\Im(\delta n)\sin(\Gamma n + \phi))\cos(\Gamma_1 n + \psi), \quad [8b]$$

If we define $$\alpha = \Gamma n + \phi, \text{ and } \beta = \Gamma_1 n + \psi, \quad [9]$$

the real and imaginary channel waveforms may be expressed as:

$$R\Re(\delta n) = S\Re(\delta n)\cos(\alpha)\cos(\beta) + S\Im(\delta n)\sin(\alpha)\cos(\beta), \quad [10a]$$

$$R\Im(\delta n) = -(S\Re(\delta n)\cos(\alpha)\cos(\beta) + S\Im(\delta n)\sin(\alpha)\cos(\beta)), \quad [10b]$$

Using the standard trigonometric identities, $$\cos(\alpha)\cos(\beta) = \frac{1}{2}(\cos(\alpha - \beta) + \cos(\alpha + \beta)), \quad [11a]$$

$$\cos(\alpha)\sin(\beta) = \frac{1}{2}(-\sin(\alpha - \beta) + \sin(\alpha + \beta)), \quad [11b]$$

$$\sin(\alpha)\sin(\beta) = \frac{1}{2}(\cos(\alpha - \beta) - \cos(\alpha + \beta)), \quad [11c]$$

the real and imaginary channel waveforms may be expressed as:

$$R_{\Re}(\delta n) = S_{\Re}(\delta n)\frac{1}{2}(\cos(\alpha - \beta) + \cos(\alpha + \beta)) + S_{\Im}(\delta n)\frac{1}{2}(\sin(\alpha - \beta) + \sin(\alpha + \beta)), \quad [12a]$$

$$R_{\Im}(\delta n) = S_{\Re}(\delta n)\frac{1}{2}(-\sin(\alpha - \beta) + \sin(\alpha + \beta)) + S_{\Im}(\delta n)\frac{1}{2}(\cos(\alpha - \beta) + \cos(\alpha + \beta)). \quad [12b]$$

The $\alpha$ and $\beta$ variables denote frequencies and phases. If the digital downconverter NCO frequency is set to the effective frequency (see eq. [5]), then $$\alpha - \beta = \phi - \psi = \Delta\theta, \text{ and } \alpha + \beta = 2\Gamma n + \phi + \psi, \quad [13]$$

and eqs. [12a-b] may be re-written as:

$$R_{\Re}(\delta n) = S_{\Re}(\delta n)\frac{1}{2}(\cos(\Delta\theta) + \cos(2\Gamma n + \phi + \psi)) + S_{\Im}(\delta n)\frac{1}{2}(\sin(\Delta\theta) + \sin(2\Gamma n + \phi + \psi)), \quad [14a]$$

$$R_{\Im}(\delta n) = S_{\Re}(\delta n)\frac{1}{2}(-\sin(\Delta\theta) + \sin(2\Gamma n + \phi + \psi)) + S_{\Im}(\delta n)\frac{1}{2}(\cos(\Delta\theta) + \cos(2\Gamma n + \phi + \psi)). \quad [14b]$$

Equations [14a-b] can be further simplified if the effective frequency is greater than one half the final bandwidth, and the $2\Gamma n$ terms are ignored:

$$R_{\Re}(\delta n) = \frac{1}{2}\big(S_{\Re}(\delta n)\cos(\Delta\theta) + S_{\Im}(\delta n)\sin(\Delta\theta)\big), \quad [15a]$$

$$R_{\Im}(\delta n) = \frac{1}{2}\big(-S_{\Re}(\delta n)\sin(\Delta\theta) + S_{\Im}(\delta n)\cos(\Delta\theta)\big). \quad [15a]$$

The NMR operation of first order phasing sets the phase angle to zero, and eqs. [15a-b] then become:

$$R_{\Re}(\delta n) = \frac{1}{2}S_{\Re}(\delta n), \quad [16a]$$

$$R_{\Im}(\delta n) = \frac{1}{2}S_{\Im}(\delta n), \quad [16b]$$

allowing recovery of the NMR modulation of interest S as a function of the measured NMR signal R.

If the digital downconverter NCO frequency is different from the carrier frequency by $\Delta f$, then the receiver is offset from the transmitter:

$$\alpha - \beta = 2\pi\Delta f + (\phi - \psi), \text{ and } \alpha + \beta = 2\Gamma n + 2\pi\Delta f + \phi + \psi, \quad [17]$$

Without any additional filtering, sampling in this manner allows mapping all frequencies onto a frequency range of zero to the sampling rate divided by two. The following table lists several frequencies and calculated corresponding parameter values.

TABLE 1

| Original Frequency | Ratio | Normalized frequency | Aliased frequency (MHz) | 2 * effective frequency ($f_{eff}$) | Clear sw/2 (desired bandwidth) (MHz) |
|---|---|---|---|---|---|
| 695.0 | 17.375 | 0.375 | 15.000 | 30.00 | 15.000 |
| 400.001 | 10.000025 | 0.000025 | 0.001 | 0.002 | 0.001 |
| 399.999 | 9.999975 | 0.999975 | 39.999 | 39.998 | 0.001 |
| 101.00 | 2.525 | 0.525 | 21.000 | 2.000 | 19.000 |
| 20.01 | 0.50025 | 0.50025 | 20.01 | 0.02 | 19.99 |
| 377.7 | 9.4425 | 0.4425 | 17.7 | 35.4 | 17.4 |
| 501.00 | 12.525 | 0.525 | 21.000 | 2.000 | 19.00 |
| 399.677 | 9.991925 | 0.991925 | 39.677 | 39.354 | 0.323 |
| 499.763 | 12.494075 | 0.494075 | 19.763 | 39.526 | 19.763 |

If the effective frequency is less than the desired bandwidth, an aliased copy of the NMR signal is present within the band of interest. Shifting the NCO frequency would generally not change the spacing/location of the aliased copy. The aliased copy may be placed out of the band of interest by appropriately setting the carrier frequency so that any aliased copies are outside the band of interest.

The exemplary phase determination systems and methods described above allow relating transmitter and receiver phases in NMR systems. NMR experiments commonly rely on the phase relationship between the sample spins of interest, the transmitter, and receiver. The spins induce voltages in the receiver coils referenced to the phase at which the transmitter excited them. Thus, accurately determining the relationship between the transmitter and receiver phases can provide valuable information on the spins of interest.

In exemplary systems and methods described above, transmitter phase starts accumulating when the transmitter is reset, which can be defined to correspond to n=0. After that time, a particular time may be identified by a sample number $$n_{ref} = t \times f_s.$$ [18]

The transmitter phase at that time is then:

$$\phi = 2\pi f_{eff} n_{ref} \text{ modulo } 2\pi$$ [19]

Eq. [19] allows computing the transmit phase from the reference clock count and the effective frequency. If the digital downconverter NCO and the transmit carrier frequency synthesizer have not been reset, and NCO and transmit carrier phases are locked together. A common clock is used for both the NCO and transmit synthesizer.

The downconverter NCO phase can be determined using an equation similar to eq. [18], with the appropriate corresponding sampling count and effective frequency. Consequently, the systems and methods described above allow computing the downconverter NCO and transmitter phase and the differences between the two phases. A user's desired receiver phase may be added, and the signal corrected accordingly.

For multiple transmit frequencies of interest, a full description of the transmit phase may be given by $$\Phi = \Sigma f_i \times \delta t_i,$$ [20a]

which can be re-written in the sampling-count domain as:

$$\Phi = \frac{\sum f_i \times \delta n_i}{f_s},$$ [20b]

where $f_i$ denotes each frequency of interest and $f_s$ is the sampling frequency.

The phase correction of the digital data may be achieved by a baseband multiplication of the real and imaginary data points by $$d\Re(i) = D\Re(i)\cos\Phi - D\Im(i)\sin\Phi,$$ [20c]

$$d\Im(i) = D\Re(i)\sin\Phi - D\Im(i)\cos\Phi,$$ [20d]

The exemplary systems and methods described above allow accurately tracking the phase relationship between the carrier frequency components of corresponding transmit and receive NMR signals. The phase relationship may be used to apply a complex-valued phase correction to a digital received NMR signal in a system using digital downconversion and subsampling, in order to generate appropriate (correct) signal values from computed values which may correspond to a carrier phase offset. An initial known phase relationship between a transmit synthesizer and a digital downconverter numerically-controller oscillator (NCO), established for example by synchronous resets of the synthesizer and the NCO, may change as a result of subsequent events such as independent resets of the transmit synthesizer or digital downconverter NCO, or carrier frequency changes, among others. A carrier phase correction as described above may be performed to account for any resulting differences between transmit and receive phases.

It will be clear to one skilled in the art that the above embodiments may be altered in many ways without departing from the scope of the invention. Accordingly, the scope of the invention should be determined by the following claims and their legal equivalents.

What is claimed is:

1. A nuclear magnetic resonance (NMR) measurement method comprising:
   synchronizing a transmit signal synthesizer and a sampling counter, wherein the transmit signal synthesizer generates at least a carrier-frequency component of an NMR radio-frequency (RF) transmit signal;
   incrementing a signal sampling count generated by the sampling counter and digitally sampling a received NMR signal at a sampling frequency $f_s$ lower than a carrier frequency $f_c$ of the carrier-frequency component of the transmit NMR signal and a received NMR signal, wherein the received NMR signal is generated by an NMR sample in response to the transmit signal;
   storing a value of the sampling count indicating the transmit phase of the transmit signal with reference to a time of synchronizing the transmit signal synthesizer and sampling counter;
   digitally downconverting the received NMR signal; and
   performing a phase correction to the digitized downconverted NMR signal according to the stored value of the sampling count.

2. The method of claim 1, wherein the sampling count is a monotonously-increasing time count.

3. The method of claim 1, wherein the sampling count is a phase count incremented modulo a carrier-frequency phase cycle.

4. The method of claim 1, wherein storing the value of the sampling count is performed at a start of a transient sample period.

5. The method of claim 1, wherein synchronizing the transmit signal synthesizer and the sampling counter comprises using a real-time controller to synchronously reset the transmit signal synthesizer and the sampling counter.

6. The method of claim 1, wherein performing the phase correction comprises identifying an entry in a sin/cos lookup table corresponding to the sampling count, and performing the phase correction according to the entry in the sin/cos lookup table.

7. The method of claim 1, wherein performing the phase correction comprises determining the transmit phase of the transmit signal according to a relation $\phi = 2\pi f_{eff} n_{ref}$ modulo $2\pi$, wherein $f_{eff}$ denotes an effective carrier frequency, and $n_{ref}$ denotes the sampling count.

8. The method of claim 1, wherein the carrier frequency $f_c$ of the transmit signal is higher than 300 MHz and lower than 1 GHz, and wherein the sampling frequency $f_s$ is higher than 50 MHz and lower than 200 MHz.

9. The method of claim 1, further comprising applying the transmit signal to an NMR sample to generate the received NMR signal.

10. A nuclear magnetic resonance (NMR) apparatus comprising:
- a transmit signal synthesizer configured to generate at least a carrier-frequency component of an NMR radio-frequency (RF) transmit signal transmitted to a NMR RF coil, the carrier-frequency component having a carrier frequency $f_c$;
- an analog-to-digital converter configured to digitally sample a received NMR signal at a sampling frequency $f_s$ lower than the carrier frequency $f_c$, wherein the received NMR signal is generated by an NMR sample in response to the transmit signal, wherein the received NMR signal sampled by the analog-to-digital converter has the carrier frequency $f_c$;
- a sampling counter storing a signal sampling count incremented at the sampling frequency $f_s$;
- a sampling count register connected to the sampling counter and configured to store a value of the signal sampling count indicating a transmit phase of the transmit signal with reference to a time of a synchronization of the transmit signal synthesizer and sampling counter;
- a real-time controller connected to the transmit signal synthesizer and the transmit signal sampling counter, and configured to synchronize the transmit signal synthesizer and the transmit signal sampling counter;
- a digital downconverter connected to the analog-to-digital converter, and configured to digitally downconvert the received NMR signal; and
- signal processing logic connected to the sampling count register and the digital downconverter and configured to perform a phase correction to the digitized downconverted NMR signal according to the stored value of the sampling count.

11. The apparatus of claim 10, wherein the sampling count is a monotonously-increasing time count.

12. The apparatus of claim 10, wherein the sampling count is a phase count incremented modulo a carrier-frequency phase cycle.

13. The apparatus of claim 10, wherein the sampling count register stores the signal sampling count at a start of a transient sample period.

14. The apparatus of claim 10, wherein the real-time controller is configured to synchronize the transmit signal synthesizer and the sampling counter by synchronously resetting the transmit signal synthesizer and the sampling counter.

15. The apparatus of claim 10, wherein performing the phase correction comprises identifying an entry in a sin/cos lookup table corresponding to the sampling count, and performing the phase correction according to the entry in the sin/cos lookup table.

16. The apparatus of claim 10, wherein performing the phase correction comprises determining the transmit phase of the transmit signal according to a relation $\phi=2\pi f_{eff} n_{ref}$ modulo $2\pi$, wherein $f_{eff}$ denotes an effective carrier frequency, and $n_{ref}$ denotes the sampling count.

17. The apparatus of claim 10, wherein the carrier frequency $f_c$ of the transmit signal is higher than 300 MHz and lower than 1 GHz, and wherein the sampling frequency $f_s$ is higher than 50 MHz and lower than 200 MHz.

18. The apparatus of claim 10, further comprising:
- an NMR spectrometer magnet configured to apply a static magnetic field to the sample; and
- an NMR probe comprising an RF coil connected to the transmit signal synthesizer and configured to apply to the sample an RF magnetic field generated according to the transmit NMR signal.

19. A nuclear magnetic resonance (NMR) measurement method comprising:
- digitizing a received NMR signal at a sampling frequency $f_s$, the received NMR signal having a carrier frequency component having a carrier frequency higher than the sampling frequency $f_s$;
- using a hardware counter to periodically increment a count indicative of a phase of the carrier frequency component with reference to a reference event;
- digitally downconverting the digitized received NMR signal; and
- performing a phase correction to the digitized received NMR signal according to the count.

20. The method of claim 19, wherein the count is a monotonously-increasing time count.

21. The method of claim 19, wherein the count is a phase count incremented modulo a carrier-frequency phase cycle.

22. A nuclear magnetic resonance (NMR) apparatus comprising:
- an analog-to-digital converter configured to digitize a received NMR signal at a sampling frequency I, the received NMR signal having a carrier frequency component having a carrier frequency $f_c$ higher than the sampling frequency $f_s$;
- a counter configured to periodically increment a count indicative of a phase of the carrier frequency component with reference to a reference event;
- a digital downconverter connected to the analog-to-digital converter, and configured to digitally downconvert the digitized received NMR signal; and
- signal processing logic connected to the counter and the digital downconverter and configured to perform a phase correction to the digitized NMR signal according to the count.

23. The apparatus claim 22, wherein the count is a monotonously-increasing time count.

24. The apparatus claim 22, wherein the count is a phase count incremented modulo a carrier-frequency phase cycle.

* * * * *

UNITED STATES PATENT AND TRADEMARK OFFICE
CERTIFICATE OF CORRECTION

PATENT NO. : 8,324,897 B2
APPLICATION NO. : 12/616727
DATED : December 4, 2012
INVENTOR(S) : Phillip Allen Hornung Page 1 of 1

It is certified that error appears in the above-identified patent and that said Letters Patent is hereby corrected as shown below:

On Title page, field (57), under "ABSTRACT", in column 2, line 12, delete "start," and insert -- start. --, therefor.

In column 14, line 19, in claim 19, delete "frequency higher" insert -- frequency $f_c$ higher --.

In column 14, line 35, in claim 22, delete "I," and insert -- $f_s$, --, therefor.

Signed and Sealed this
Nineteenth Day of February, 2013

Teresa Stanek Rea
*Acting Director of the United States Patent and Trademark Office*